United States Patent [19]
Choi

[11] Patent Number: 5,708,616
[45] Date of Patent: Jan. 13, 1998

[54] LOW NOISE SENSE AMPLIFIER CONTROL CIRCUITS FOR DYNAMIC RANDOM ACCESS MEMORIES AND RELATED METHODS

[75] Inventor: Jong-Hyun Choi, Kyungki-do, Rep. of Korea

[73] Assignee: Samsung Electronics Co., Ltd., Suwon, Rep. of Korea

[21] Appl. No.: 674,532

[22] Filed: Jul. 5, 1996

[30] Foreign Application Priority Data

Jul. 6, 1995 [KR] Rep. of Korea ............ 95-19793

[51] Int. Cl.⁶ ............................................. G11C 7/00
[52] U.S. Cl. ............ 365/205; 365/189.09; 365/189.07; 365/189.11; 365/207; 365/185.2; 365/185.23; 365/185.26
[58] Field of Search ............... 365/189.01, 189.09, 365/189.07, 189.11, 205, 207

[56] References Cited

U.S. PATENT DOCUMENTS

| | | | |
|---|---|---|---|
| 5,301,261 | 4/1994 | Furutani et al. | 365/189.01 |
| 5,315,550 | 5/1994 | Tobita | 365/193 |
| 5,521,878 | 5/1996 | Ohtani et al. | 365/233 |
| 5,544,121 | 8/1996 | Dosaka et al. | 365/230.03 |

*Primary Examiner*—Viet Q. Nguyen
*Attorney, Agent, or Firm*—Myers, Bigel, Sibley & Sajovec, L.L.P

[57] ABSTRACT

An integrated circuit memory device includes a pair of bit lines, a memory cell connected to one of the bit lines, a sense amplifier connected between the bit lines, and a sense amplifier control circuit. The sense amplifier control circuit generates a sense amplifier drive signal on a sense amplifier drive node responsive to an enable signal. The sense amplifier control circuit includes a comparison circuit, a drive circuit, and a driver. The comparison circuit generates a comparison signal in response to a comparison of the sense amplifier drive signal and a predetermined reference signal, and in response to the enable signal. The drive circuit generates a gating signal in response to the comparison signal and in response to a magnitude of the sense amplifier drive signal so that the gating signal has a first magnitude when the sense amplifier drive signal is below a predetermined threshold and a second magnitude when the sense amplifier drive signal is above the predetermined threshold. The driver provides electrical energy to the sense amplifier drive node responsive to the gating signal so that electrical energy is provided at a first rate when the gating signal has the first magnitude, and electrical energy is provided at a second rate when the gating signal has the second magnitude thereby generating the sense amplifier drive signal. The sense amplifier is connected between the pair of bit lines, and detects and amplifies a difference between voltages of the bit lines responsive to the sense amplifier drive signal on the sense amplifier drive node. Related methods are also discussed.

23 Claims, 4 Drawing Sheets

5,708,616

1

LOW NOISE SENSE AMPLIFIER CONTROL CIRCUITS FOR DYNAMIC RANDOM ACCESS MEMORIES AND RELATED METHODS

FIELD OF THE INVENTION

The present invention relates to the field of integrated circuit memory devices and more particularly to dynamic random access memories.

BACKGROUND OF THE INVENTION

As integrated circuit memory devices become more highly integrated, the size of the transistors formed on the memory become smaller and the oxide films used to form these transistors become thinner. In particular, transistors used for these memory devices are currently produced on a sub-micron scale. Accordingly, the size of the sense amplifiers is reduced. In addition, the increased storage capacity of these highly integrated memory devices results in an increase in the instantaneous current consumed by the memory device thus generating ground noise which adversely affects the operation of the memory. Furthermore, the use of smaller transistors may allow operation of these memory devices at a lower power voltage. Accordingly, there exists a need in the art to reduce the effects of ground noise generated by the relatively high peak instantaneous currents.

In a dynamic random access memory (DRAM), most of the current is consumed within the memory cell array and its peripheral circuits. A high density of memory cells results in an increase of the current consumed by the memory cell array, because in a highly integrated DRAM, the number of memory cells driven by one active word line and the number of memory cells connected to one bit line pair increase. Accordingly, when a word line is activated by providing a low address strobe $\overline{RASB}$, the cell transistors of all memory cells connected to the activated word line are turned on. The charge stored in each storage capacitor is thus transmitted to one bit line of the associated bit line pair and a resulting voltage difference ($\Delta V_{BL}$) of each bit line pair is amplified by the respective sense amplifier.

The electrical noise generated on the ground voltage $V_{ss}$ and/or the power voltage $V_{cc}$ provided to the sense amplifiers generally depends on the number of memory cells connected to the bit line pair and the number of memory cell array transistors driven by the activated word line. In other words, the greater the number of memory cells connected to each word line and the greater the number of memory cells connected to each bit line pair, the more the time is increased to amplify the voltage difference ($\Delta V_{BL}$) of the bit line pairs because of the noise generated on the ground voltage and/or the power source dip. In addition, the noise on the ground voltage and/or the power source dip may affect the operation of the peripheral circuit thereby causing operational failures.

A conventional sense amplifier control circuit is illustrated in FIG. 1. This circuit is designed to control a driving voltage of a P sense amplifier PSA in a sense amplifier connected to the bit line pair BL and BLB at a level corresponding to that of an external power voltage $EV_{cc}$.

The sense amplifier control circuit includes a comparator circuit 50A, a level shift circuit 50B, a comparator enable circuit 50C, a trigger circuit 50D, a bias circuit 50E, and a driver control circuit 50F. The comparator circuit 50A includes PMOS transistors 11 and 12 and NMOS transistors 13, 14, and 15. The level shift circuit 50B includes PMOS transistors 19 and 20, NMOS transistors 21 and 22, and an

2 inverter 23. The comparator enable circuit 50C includes a PMOS transistor 16, and the trigger circuit 50D includes a PMOS transistor 17 and an NMOS transistor 18. The bias circuit 50E includes a PMOS transistor 24 and NMOS transistors 25 and 26, and the driver control circuit 50F includes PMOS transistors 27, 30 and 31, and NMOS transistors 28 and 29.

The NMOS transistor of the memory cell MC has a drain connected to the bit line BL and a source connected to a storage capacitor. This NMOS transistor is switched in response to an input of word line driving signals, and when switched on connects the storage capacitor, which stores one bit of data, to the bit line BL. The sense amplifier includes a P sense amplifier PSA and an N sense amplifier NSA each connected between the bit line pair BL and BLB.

An internal power voltage IVC is provided to the source of the PMOS transistor 24 of the bias circuit 50E and to the inverter 23 of the level shift circuit 50B. This internal power voltage IVC has a lower voltage level than that of the external power voltage $EV_{cc}$.

In the structure of FIG. 1, the output node SAP of PSA drivers 1 and 5, and node SAN of the NSA drivers, and the bit line pair BL and BLB are all precharged to a voltage level of IVC/2 when a sense enable signal $\phi SP$ is in a non-active state. In the circuit of FIG. 1, the non-active state of the sense enable signal $\phi SP$ is a low logic voltage level. The sense enable signal $\phi SP$ goes to a logic high voltage level when a low address strobe $\overline{RASB}$ is driven to a low logic level. The operation of the sense amplifier control circuit of FIG. 1 will be discussed as follows.

When the sense enable signal $\phi SP$ is driven to an active high level, the comparator circuit 50A including the PMOS transistors 11 and 12 and including the NMOS transistors 13–15 is enabled. The level shift circuit 50B including PMOS transistors 19 and 20, NMOS transistors 21 and 22, and inverter 23 is also enabled. The enabled comparator circuit 50A compares a voltage level of the node SAP and a reference voltage $V_{REF}$ applied to the memory cell and generates an output at node N1 indicating the result of the comparison. The node SAP is located at the output of PSA drivers 1 and 5 which are each illustrated as a single PMOS transistor.

When the sense enable signal $\phi SP$ is driven to a voltage level equal to that of the internal power voltage IVC, the level shift circuit 50B generates an active output signal having a voltage level equal to that of the external power voltage $EV_{cc}$. In other words, when the sense enable signal $\phi SP$ is driven to an active high state, a logic high signal having a level of the external power voltage $EV_{cc}$ is generated. The comparator enable circuit 50C including PMOS transistor 16 is connected to the output node N1 of the comparator circuit 50A, and this transistor generates an output which is inverted from the output of the level shift circuit 50B. Thus, the comparator enable circuit 50C disables the output node N1 of the comparator circuit 50A in response to the sense enable signal $\phi SP$. The comparator enable circuit 50C thus removes a direct current component from the trigger circuit 50D when the sense enable signal $\phi SP$ is in a non-enabled state (logic low level) and prevents the PSA drivers 1 and 5 from being turned on.

The trigger circuit 50D includes PMOS transistor 17 and NMOS transistor 18 connected in an inverter structure. This trigger circuit 50D inverts the output of the comparator circuit 50A and supplies a control signal to an input node N2 of the driver control circuit 50F. The bias circuit 50E includes PMOS transistor 24 and NMOS transistors 25 and 26, and this circuit supplies a control voltage having a lower variation than that of the external power voltage $EV_{cc}$ to the gate of NMOS transistor 29. NMOS transistor 29 is a driving device in the driver control circuit 50F and receives the signal from the trigger circuit 50D when the sense enable signal φSP is at an active high level. Accordingly, the current flowing between the drain and source of NMOS transistor 29 can be uniformly controlled. The bias circuit 50E thus reduces variation of the driving current of the PSA drivers 1 and 5 resulting from variations in the external power voltage $EV_{cc}$.

The driver control circuit 50F includes PMOS transistors 27, 30 and 31, and NMOS transistors 28 and 29. The driver control circuit 50F receives the output of the trigger circuit 50D and the output of the bias circuit 50E in order to generate the driver control signal at node φPSE which is connected to the gates of the PMOS transistors which make up the PSA drivers 1 and 5. The source of each of the PSA drivers 1 and 5 is connected to the external power voltage $EV_{cc}$, and each drain is connected to the node SAP of the P sense amplifier PSA.

Thus, when the sense enable signal φSP is driven to the active high level, the NMOS transistor 15 acts as a current source, and the voltage of the node φPSE of the PSA driver control circuit 50F is maintained at a uniform level according to the comparison of the voltage of the node SAP and the reference voltage $V_{REF}$. By maintaining a uniform voltage on the node φPSE, a voltage $V_{GS}$ between the source and gate becomes relatively uniform irrespective of the level of the external power voltage $EV_{cc}$ applied to the source of the PSA drivers 1 and 5. Accordingly, the voltage applied at node SAP of the P source amplifier PSA can be uniformly controlled.

In the sense amplifier control circuit discussed above, however, a surge current may flow through the NMOS transistor 29 of the driver control circuit 50F when the sense enable signal φSP changes from the low logic level to the high logic level. Accordingly, the voltage $V_{GS}$ between the gate and source of the PSA drivers 1 and 5 may increase rapidly. Accordingly, when the sense enable signal φSP is initially activated, a large current may initially flow to the node SAP of the P sense amplifier PSA thereby causing the external power voltage $EV_{cc}$ to dip. When the external power voltage $EV_{cc}$ dips as discussed above, the time required to amplify the voltage difference ($\Delta V_{BL}$) between the bit line pair BL and BLB may be increased.

As shown in FIG. 5, when the sense enable signal ΔSP is maintained at the enabled state, the voltage of node ΔPSE of the driver control circuit 50F may be uniformly maintained as shown in the B portion of line 200. Accordingly, the voltage $V_{GS}$ of PSA drivers 1 and 5 may be maintained at a relatively uniform level despite variations of the external power voltage $EV_{cc}$. The voltage of the node φPSE of the driver control circuit 50F, however, may change rapidly as shown in an A portion of the line 200 of FIG. 5 when the sense enable signal φSP is enabled from the low state to the high state. Accordingly, the voltage $V_{GS}$ of the PSA drivers 1 and 5 may instantly increase.

In the memory circuit discussed above, the external power voltage may dip when the sensing enable signal φSP is initially activated from the low to high state. Accordingly, the time required to amplify the voltage difference between the bit line pair BL and BLB may be increased thus reducing the access speed of the memory device. Accordingly, there continues to exist a need in the art for a sense amplifier control circuit which reduces the dip in the external power voltage when the sense enable signal is activated.

SUMMARY OF THE INVENTION

It is therefor an object of the present invention to provide improved sense amplifier control circuits and methods for integrated circuit memory devices.

It is another object of the present invention to provide sense amplifier control circuits which reduce electrical noise generated in integrated circuit memory devices.

These and other objects are provided according to the present invention in an integrated circuit memory device including a pair of bit lines, a memory cell, a sense amplifier control circuit, and a sense amplifier. The memory cell is connected to one of the bit lines, and the sense amplifier is connected between the pair of bit lines. The sense amplifier detects and amplifies a difference between the voltages of the bit lines responsive to a sense amplifier drive signal on a sense amplifier drive node which is generated by the sense amplifier control circuit.

According to the invention, the sense amplifier control circuit compares the sense amplifier drive signal and a predetermined reference signal in response to an enable signal and generates a comparison signal in response to this comparison. When the sense amplifier drive signal is less than the predetermined reference signal and the sense amplifier drive signal is below a predetermined threshold, a gating signal having a first magnitude is generated at a gate node. When the sense amplifier drive signal is less than the predetermined reference signal and the sense amplifier drive signal is above the predetermined threshold, a gating signal having a second magnitude is generated at the gate node. This gate node is connected to the input of a driver so that electrical energy is provided to the sense amplifier drive node at a first rate when the gating signal has the first magnitude, and so that electrical energy is provided to the sense amplifier drive node at a second rate when the gating signal has the second magnitude.

Accordingly, when the enable signal is initially activated, and the sense amplifier drive node has not been charged, the drive node can be charged at a first relatively slow rate so that a power voltage does not dip excessively. Once the drive node has been charged above the predetermined threshold, the drive node can be charged at a quicker rate thus reducing the time required to charge the drive node to the predetermined reference voltage.

In particular, the gate node may be connected to a power voltage via a pull-up circuit, so that the gating signal has a third magnitude in response to an absence of the comparison signal thus turning the driver off. When the sense amplifier drive signal is both below the predetermined reference voltage and below the predetermined threshold, the gate node may be connected to the ground voltage through a load circuit. When the sense amplifier drive signal is below the predetermined reference voltage but above the predetermined threshold, the gate node may be connected to the ground voltage through a by-pass circuit. The degree to which the driver is turned on is thus determined by the magnitude of the sense amplifier drive signal.

According to the present invention, a dip in the power voltage can thus be reduced when a memory circuit is initially enabled without necessarily increasing the time required to charge the sense amplifier drive node.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
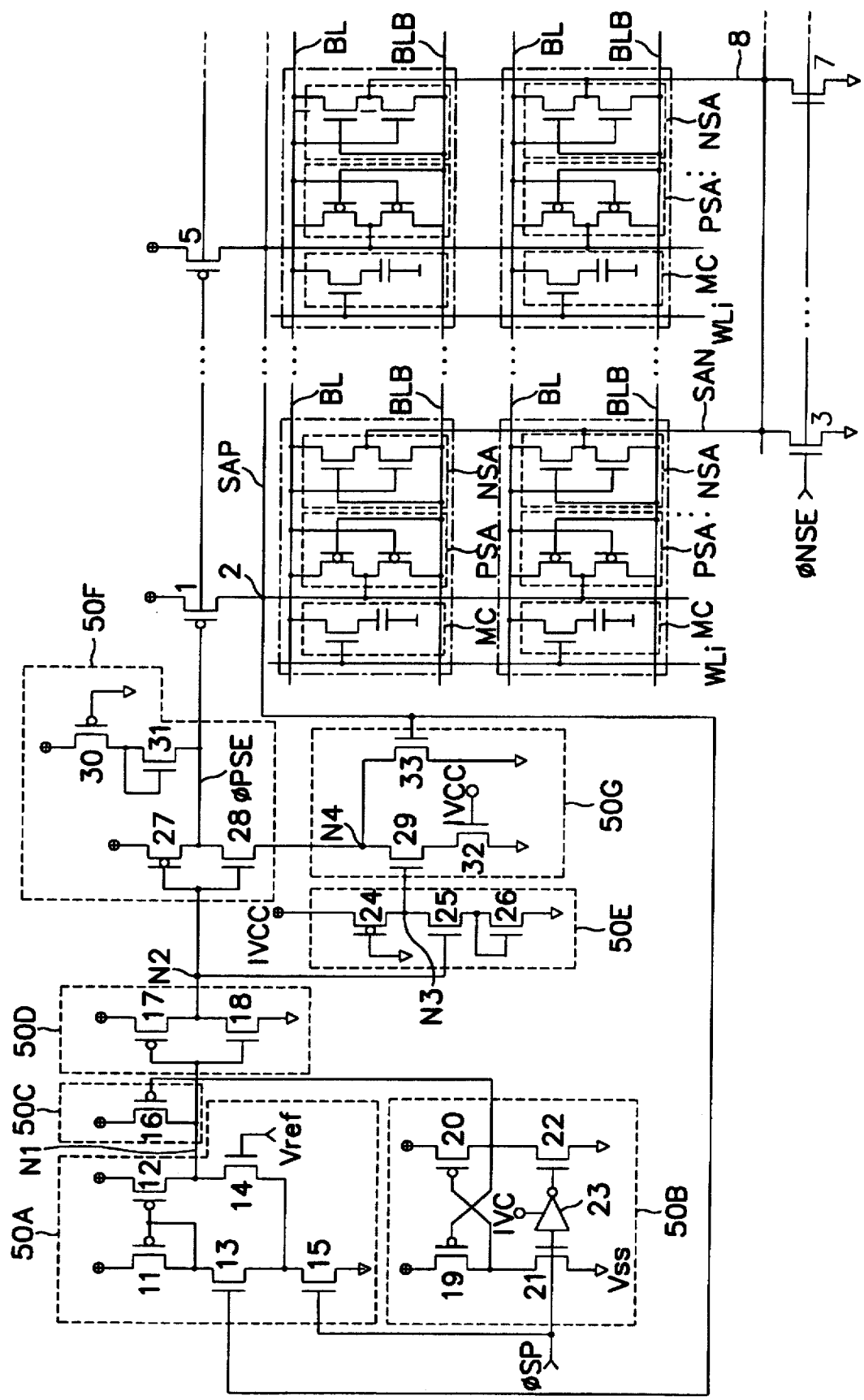
FIG. 2 illustrates a schematic diagram of a sense amplifier control circuit according to the present invention.

FIG. 2 is a circuit diagram of a sense amplifier control circuit according to the present invention. This control circuit includes a MOS transistor 32 which provides a predetermined resistance between a reference voltage such as the ground voltage $V_{ss}$ and a source of the NMOS transistor 29. The gate of the NMOS transistor 29 is connected to the output node N3 of the bias circuit 50E. In addition, the synchronization current control circuit 50G includes NMOS transistor 33 with a drain to source channel connected between the drain of the NMOS transistor 29 and the ground voltage $V_{ss}$. The gate of NMOS transistor 33 is connected to the node SAP at the source of source amplifier drivers 1 and 5.

The sense amplifier control circuit of FIG. 2 controls the gate to source voltage $V_{GS}$ of the sense amplifier drivers 1 and 5 so that this voltage does not change too rapidly when the sense enable signal ɸSP is initially activated to the logic high level. The gate to source voltage $V_{GS}$ of the sense amplifier drivers 1 and 5 is controlled to increase as the sense amplifier driving signal of the P sense amplifier PSA increases to amplify the voltage supplied to the memory cell. This circuit thus provides a sensing voltage and a restoring voltage as will be discussed in greater detail below.

Figure 3:
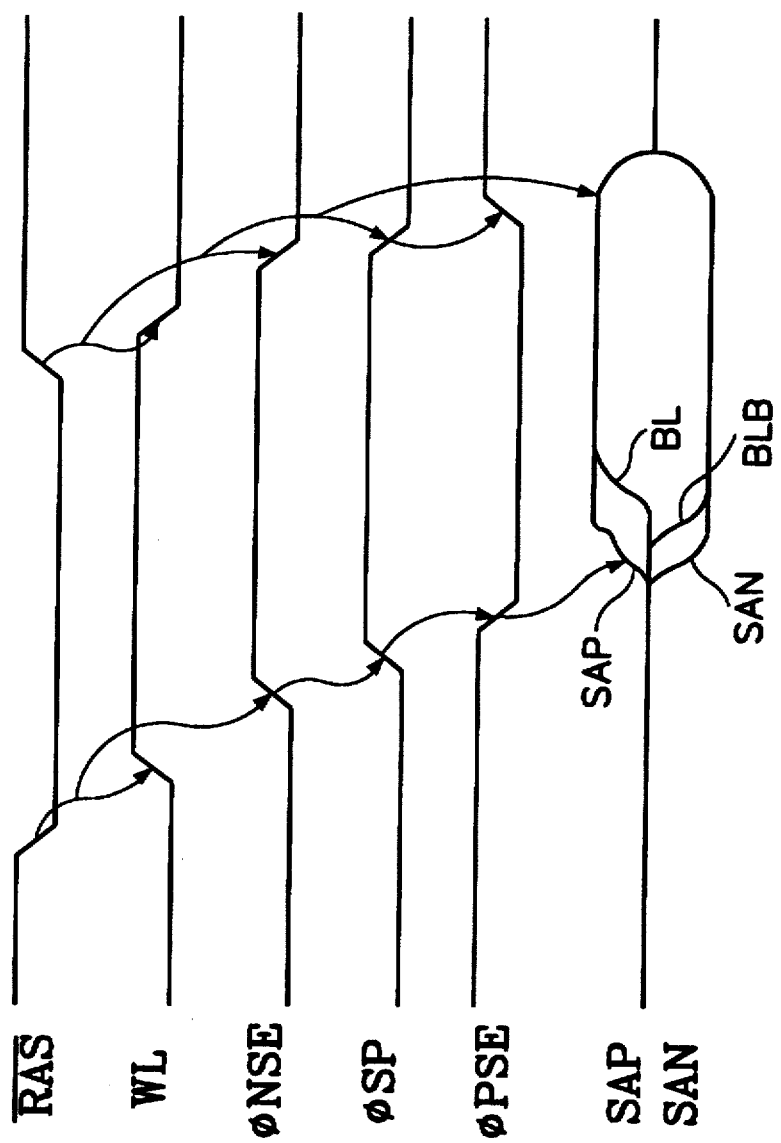
FIG. 3 illustrates an operational timing diagram for a portion of the control circuit of FIG. 2.
Figure 4:
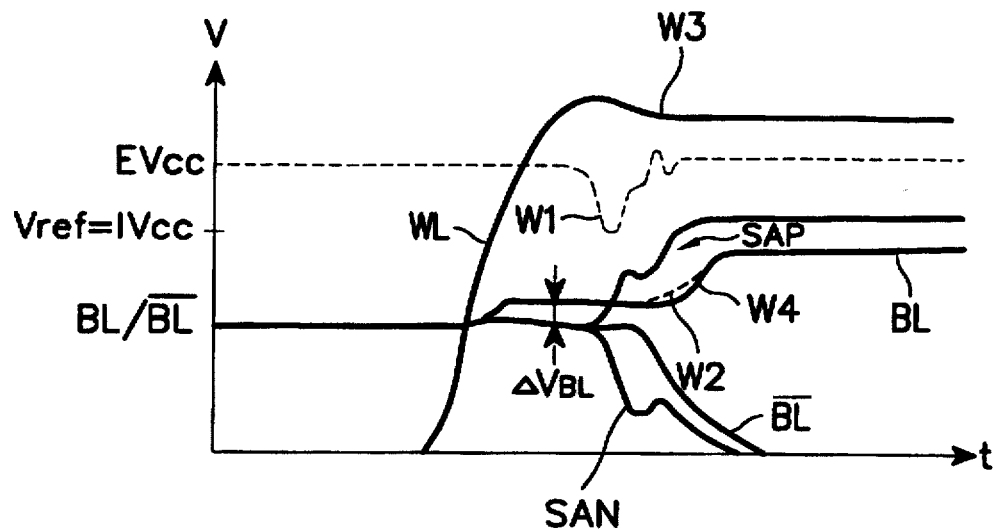
FIG. 4 graphically illustrates the voltage characteristic of an external power voltage and a bit line of the control circuit of FIG. 2.

FIG. 3 illustrates a timing diagram for a portion of the circuit of FIG. 2. FIG. 4 graphically illustrates the voltage characteristics of the external power voltage and a bit line of the sense amplifier control circuit of FIG. 2. When the sense enable signal ɸSP is initially activated from the low level to the high level after a word line WL is activated, the voltage waveform at node ɸPSE, a voltage difference ($\Delta V_{BL}$) of a bit line pair BL and BLB, and the voltages at nodes SAP and SAN of the sense amplifier which are amplified are illustrated.

Figure 1:
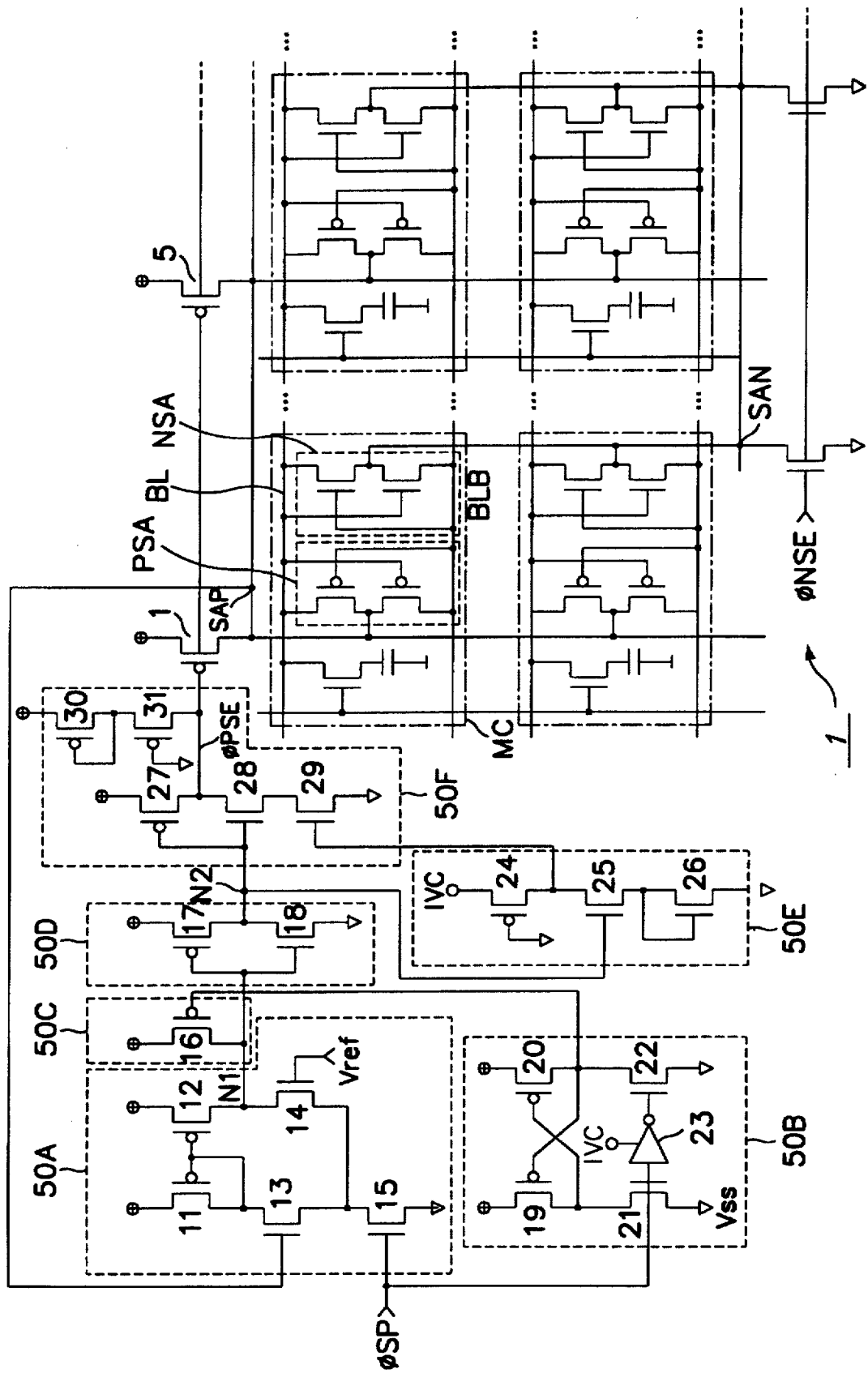
FIG. 1 illustrates a schematic diagram of a sense amplifier control circuit for a semiconductor memory device according to the prior art.
Figure 5:
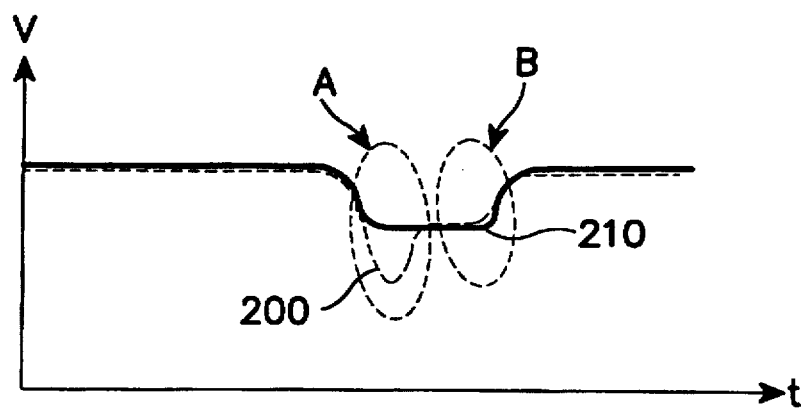
FIG. 5 graphically illustrates the voltage characteristic of the P sense amplifier control node of the sense amplifier control circuit of FIGS. 1 and 2.

FIG. 5 illustrates voltage characteristics of a P sense amplifier control node of the sense amplifier control circuit of FIG. 2. The reference numeral 200 indicates a waveform ɸPSE in accordance with the operation of the sense amplifier control circuit of FIG. 1, while reference numeral 210 indicates a waveform of the ɸPSE of the sense amplifier control circuit of FIG. 2.

The operation of the sense amplifier control circuit of the present invention will now be described with reference to FIGS. 2–5. When a row address strobe $\overline{RAS}$ is activated by the output of a row address decoder signal at a low level, the associated word line WL is activated from the low level to the high level as shown in FIG. 3. When the word line WL is activated, the N sense amplifier control signal ɸNSE is activated to the high level and supplied to the gate of N source amplifier drivers 3 and 7. A sense enable signal ɸSP is then activated to the high level.

When the word line WL is activated, a transistor in the memory cell MC connected to the corresponding word line is turned on so that the capacitor is connected to the bit line BL. Accordingly, the charge stored on the capacitor is distributed to the bit line resulting in a voltage difference between the bit line pair BL and BLB. This voltage is first amplified in response to the driving signal at node SAN which has been connected to the ground voltage $V_{ss}$ through N sense amplifier drivers 3 and 7 as shown in FIG. 3.

When the sense enable signal ɸSP is activated to a high level as shown in FIG. 3, the comparator circuit 50A including the PMOS transistors 11 and 12 and the NMOS transistors 13–15 compares a voltage level of the node SAP at the output of P sense amplifier drivers 1 and 5 and a reference voltage $V_{REF}$, and generates a comparison signal at the node N1. When the comparator circuit 50A is initially enabled by the sense enable signal ɸSP, the output at node N1 is initially at a low level because the node SAP has not been charged. The low level output supplied to the trigger circuit 50D is inverted so that a signal having a high level is output to the node N2 in response to the low level input.

The trigger signal at node N2 is input to the NMOS transistor 25 of the bias circuit 50E, and the PMOS transistor 27 and the NMOS transistor 28 of the drive control circuit 50F. Accordingly, the NMOS transistor 25 is turned on in response to the trigger signal having a high level. When the NMOS transistor 25 is turned on, a voltage is generated at node N3 and this voltage is determined by the predetermined resistance of the PMOS transistor 24 with its source connected to the internal power voltage IVCC and the NMOS transistors 25 and 26. The voltage generated at the node N3 of the bias circuit 50E is provided to the gate of the NMOS transistor 29 of the synchronization control circuit 50G so that the current flowing through the channel between the source and drain of the NMOS transistor 29 is controlled.

The PMOS transistor 27 of the driver control circuit 50F is turned off by the input of the first high level trigger signal, and the NMOS transistor 28 is turned on by the high level trigger signal. A voltage on the node ɸPSE is generated by the combination of the PMOS transistor 30' and the NMOS transistor 31' connected between the node ɸPSE and the external power voltage $EV_{cc}$, and the NMOS transistors 28, 29, 32, and 33 connected between the node ɸPSE and the ground voltage $V_{ss}$. In particular, the NMOS transistor 32 provides a load via a channel through NMOS transistors 28 and 29.

The internal supply voltage IVCC is provided to the gate of NMOS transistor 32 which is thus turned on performing a loading function for a current which is synchronized with the ground voltage $V_{ss}$ via the drain and source of the NMOS transistor 29. The load of the NMOS transistor 32 prevents the voltage of the node ɸPSE from changing abruptly to a low level via the channel through NMOS transistors 28 and 29 by the first high level trigger signal. Accordingly, when the sense enable signal ɸSP is initially changed from a low level to a high level, the voltage at the node ɸPSE makes the initial transition from the high level to the low level at a relatively gradual rate through the operation of the NMOS transistor 32 as a load. Accordingly, the gate voltage of the P sense amplifier drivers 1 and 5 is changed from the high level to the low level at a relatively gradual rate when the sense amplifier control circuit is initially enabled thus reducing the dip of the external power voltage $EV_{cc}$.

When the voltage at node $\phi$PSE is changed from the high level to the low level, the P sense amplifier drivers 1 and 5 provide an electrical connection between the external power voltage $EV_{cc}$ to the node SAP of the P sense amplifier PSA. The voltage level of the node SAP thus increases in accordance with the voltage of the node $\phi$PSE which is gradually changed from the high level to the low level as shown in FIG. 3. When the voltage at the node SAP increases, the P sense amplifier PSA amplifies the voltage difference between the bit line pair BL and BLB and simultaneously provides the voltage of the node SAP to the memory cell as a restoring voltage if a high logic level is saved on the storage cell.

When the voltage of the node SAP increases, the NMOS transistor 33 is turned on. This NMOS transistor 33 includes a channel between the source and drain which connects the drain of the NMOS transistor 29 and the ground voltage $V_{ss}$. Accordingly, because the NMOS transistor 33 is controlled by the voltage at the node SAP which is a restoring line of the memory cell, the voltage $V_{SG}$ between the source and gate increases as the voltage of the node SAP increases. The voltage of the node N4 is thus pulled down to the level of the ground voltage $V_{ss}$, thus by-passing the load NMOS transistor 32 so that the voltage of the node $\phi$PSE can be pulled down to the ground voltage $V_{ss}$. When the voltage of the node SAP increases, the source to gate voltage $V_{SG}$ of the P sense amplifier drivers 1 and 5 thus becomes greater so that the restoring voltage at node SAP can be increased and supplied to the memory cell MC.

If the voltage at node SAP rises to a level of the input reference voltage $V_{REF}$ as a result of the operations discussed above, the voltage level of the node SAP is clamped at the level of the reference voltage $V_{REF}$. In particular, the comparator circuit 50A generates an output indicating that the voltage of node SAP is equal to that of the reference voltage $V_{REF}$ and this signal is processed through the level shift circuit 50B, the comparator enable circuit 50C, the trigger circuit 50D, the P sense amplifier drive control circuit 50F, and the synchronization current control circuit 50G to clamp the voltage at node SAP to the level of $V_{REF}$. When the voltage at node SAP rises higher than the reference voltage $V_{REF}$, the comparator circuit 50A generates a signal having a logic high level at the node N1, and the trigger circuit 50D outputs a trigger signal having a low level. Because the NMOS transistor 28 of the P sense amplifier driver control circuit 50F is turned off, and the PMOS transistor 27 is turned on, the voltage at the node $\phi$PSE rises to the level of the external power voltage $EV_{cc}$ so that the voltage $V_{GS}$ decreases to turn the drivers 1 and 5 off.

Accordingly, the sense amplifier control circuit discussed above controls the gate voltage of the P sense amplifier drivers 1 and 5 which supply the restoring voltage to the node SAP of the P sense amplifier when the sense enable signal $\phi$SP is initially activated from the low level to the high level to reduce a dip of the external power voltage $EV_{cc}$. This sense amplifier control circuit also controls a synchronization current by providing feedback from the node SAP to increase the restoring voltage at the node SAP so that the voltage difference between the bit line pair BL and BLB can be rapidly amplified.

As discussed above, the sense amplifier control circuit of the present invention reduces a dip of the external power voltage which may occur when the sense enable signal is initially activated from a low level to a high level. This control circuit also provides a sensing voltage of a sufficient level to the sense amplifier. Accordingly, a difference between the voltages of the bit line pair can be rapidly amplified.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device comprising:

a pair of bit lines; a memory cell connected to one of said bit lines;

a sense amplifier control circuit which generates a sense amplifier drive signal on a sense amplifier drive node responsive to an enable signal, wherein said sense amplifier control circuit comprises, a comparison circuit which generates a comparison signal in response to a comparison of the sense amplifier drive signal and a predetermined reference signal, and in response to the enable signal, a drive circuit which generates a gating signal in response to the comparison signal and in response to a magnitude of the sense amplifier drive signal so that the gating signal has a first magnitude when the sense amplifier drive signal is below a predetermined threshold and a second magnitude when the sense amplifier drive signal is above the predetermined threshold, and a driver which provides electrical energy to said sense amplifier drive node responsive to the gating signal so that electrical energy is provided at a first rate when the gating signal has the first magnitude and electrical energy is provided at a second rate when the gating signal has the second magnitude thereby generating the sense amplifier drive signal; and a sense amplifier connected between said pair of bit lines, wherein said sense amplifier detects and amplifies a difference between voltages of said bit lines responsive to the sense amplifier drive signal on said sense amplifier drive node.

2. An integrated circuit memory device according to claim 1 wherein said drive circuit generates the gating signal at a gate node, wherein the gating signal having the first magnitude is generated by connecting a load circuit between said gate node and a second predetermined reference signal, and wherein the gating signal having the second magnitude is generated by connecting said gate node to the second predetermined reference signal through a by-pass circuit when the amplifier drive signal is above the predetermined threshold.

3. An integrated circuit memory device according to claim 2 wherein said load circuit comprises a load transistor.

4. An integrated circuit memory device according to claim 2 wherein said by-pass circuit comprises a by-pass transistor and wherein said by-pass transistor is turned on when the sense amplifier drive signal is above the predetermined threshold.

5. An integrated circuit memory device according to claim 2 wherein said driver comprises a transistor which connects said sense amplifier drive node to a power supply responsive to the gating signal.

6. A sense amplifier control circuit according to claim 1 wherein said gating signal is generated on a gate node and wherein said drive circuit comprises:

a pull-up circuit connected between a power voltage and said gate node, wherein said pull-up circuit provides an electrical connection between the power voltage and said gate node so that said gating signal has a third magnitude in response to an absence of said comparison signal thus turning said driver off; and a synchronization circuit which connects said gate node to a ground voltage through a load circuit in response to the comparison signal when the sense amplifier drive signal is below the predetermined threshold and for connecting said gate node to the ground voltage through a by-pass circuit in response to the comparison signal when the sense amplifier drive signal is above the predetermined threshold.

7. A sense amplifier control circuit according to claim 6:

wherein said load circuit comprises a first transistor connected in series with a load element, wherein said first transistor provides a current path from said control node through said load element to the ground voltage in response to said trigger signal; and wherein said by-pass circuit comprises a second transistor connected in parallel with said load circuit, wherein said second transistor provides a current path from said control node to the ground voltage when the sense amplifier drive signal exceeds the predetermined threshold.

8. A sense amplifier control circuit according to claim 7 further comprising a drive transistor for connecting said control node with said load circuit and said by-pass circuit in response to said trigger signal.

9. A method for generating a sense amplifier drive signal on a sense amplifier drive node of a sense amplifier in an integrated circuit memory device including a pair of bit lines, a memory cell connected to one of the bit lines, and a sense amplifier connected between the pair of bit lines wherein the sense amplifier detects and amplifies a difference between voltages of the bit lines responsive to the sense amplifier drive signal, said method comprising the steps of:

generating a comparison signal in response to a comparison of the sense amplifier drive signal and a predetermined reference signal, and in response to an enable signal;

generating a gating signal at a gate node in response to the comparison signal and in response to a magnitude of the sense amplifier drive signal so that the gating signal has a first magnitude when the sense amplifier drive signal is below a predetermined threshold and a second magnitude when the sense amplifier drive signal is above the predetermined threshold; and providing electrical energy to said sense amplifier drive node responsive to the gating signal so that electrical energy is provided at a first rate when the gating signal has the first magnitude and electrical energy is provided at a second rate when the gating signal has the second magnitude thereby generating the sense amplifier drive signal.

10. A method according to claim 11 wherein said step of generating said gating signal on said gate node comprises the steps of:

providing an electrical connection between a power voltage and said gate node so that said gating signal has a third magnitude in response to an absence of said trigger signal so that electrical energy is not provided to said sense amplifier drive node;

providing an electrical connection from said gate node to a ground voltage through a load circuit in response to said trigger signal when the sense amplifier control signal is below the predetermined threshold; and providing an electrical connection from said gate node to the ground voltage through a by-pass circuit in response to the trigger signal when the sense amplifier control signal is above the predetermined threshold.

11. A sense amplifier control circuit for an integrated circuit memory device having a pair of bit lines, a memory cell connected to one of the bit lines, and a sense amplifier connected between the pair of bit lines for detecting and amplifying a difference in voltages of the pair of bit lines according to a sense amplifier drive signal on a sense amplifier input node, said sense amplifier control circuit comprising:

trigger means for comparing the sense amplifier drive signal with a predetermined reference voltage in response to a sense enable signal, and for generating a trigger signal in response to said comparison;

sense amplifier drive control means for generating a gate signal at a gate node in response to said trigger signal, so that said gate signal has a first magnitude when the sense amplifier drive signal is below a predetermined threshold and a second magnitude when the sense amplifier drive signal is above the predetermined threshold; and sense amplifier drive means for receiving a power voltage and generating the sense amplifier drive signal on the sense amplifier input node in response to the gate signal at said gate node.

12. A sense amplifier control circuit according to claim 11 wherein said sense amplifier drive control means further comprises biasing means for generating a bias control signal in response to the trigger signal for maintaining said control voltage at a uniform level.

13. A sense amplifier control circuit according to claim 11 wherein said sense amplifier drive control means is connected between a power source and said gate node.

14. A sense amplifier control circuit according to claim 11 wherein said sense amplifier drive means comprises a PMOS transistor with a gate connected to said gate node, a source connected to an external power voltage, and a drain connected to said sense amplifier input node.

15. A sense amplifier control circuit according to claim 11 wherein said sense amplifier drive control means comprises:

pull-up means connected between the power voltage and said gate node for providing an electrical connection between the power voltage and said gate node so that said gate signal has a third magnitude in response to an absence of said trigger signal thus turning said sense amplifier drive means off; and synchronization control means for connecting said gate node to a ground voltage through a load circuit in response to the trigger signal when the sense amplifier control signal is below the predetermined threshold and for connecting said gate node to the ground voltage through a by-pass circuit in response to the trigger signal when the sense amplifier control signal is above the predetermined threshold.

16. A sense amplifier control circuit according to claim 15:

wherein said load circuit comprises a first transistor connected in series with a load element, wherein said first transistor provides a current path from said gate node through said load element to the ground voltage in response to said trigger signal; and wherein said by-pass circuit comprises a second transistor connected in parallel with said load circuit, wherein said second transistor provides a current path from said control node to the ground voltage when the sense amplifier drive signal exceeds the predetermined threshold, thereby by-passing said load circuit.

17. A sense amplifier control circuit according to claim 16 further comprising a drive transistor for connecting said gate node with said load circuit and said by-pass circuit in response to said trigger signal.

18. A sense amplifier control circuit according to claim 16 wherein said load element comprises a MOS transistor.

19. A sense amplifier control circuit for an integrated circuit memory device having a pair of bit lines, a memory cell connected to one of the bit lines, an N sense amplifier connected between the pair of bit lines for detecting and amplifying a difference in the voltages of the pair of bit lines according to a first sense amplifier driving signal, and a P sense amplifier connected between the pair of bit lines for detecting and amplifying the difference in voltages of the pair of bit lines responsive to a restore voltage and for restoring a charge of the memory cell, said sense amplifier control circuit comprising:

trigger means for comparing the restore voltage with a predetermined reference voltage in response to a sense enable signal, and for generating a trigger signal in response to said comparison;

P sense amplifier drive control means for generating a gate voltage at a gate node in response to said trigger signal, so that said gate voltage has a first magnitude when the sense amplifier drive signal is below a predetermined threshold and a second magnitude when the sense amplifier drive signal is above the predetermined threshold; and P sense amplifier drive means for receiving a power voltage and generating the sense amplifier drive signal on the P sense amplifier input node in response to the gate voltage at said gate node.

20. A sense amplifier control circuit according to claim 19 wherein said sense amplifier drive control means comprises:

pull-up means connected between the power voltage and said gate node for providing an electrical connection between the power voltage and said gate node so that said gate voltage has a third magnitude in response to an absence of said trigger signal thus turning said sense amplifier drive means off; and synchronization control means for connecting said gate node to a ground voltage through a load circuit in response to the trigger signal when the sense amplifier control signal is below the predetermined threshold and for connecting said gate node to the ground voltage through a by-pass circuit in response to the trigger signal when the sense amplifier control signal is above the predetermined threshold.

21. A sense amplifier control circuit according to claim 20:

wherein said load circuit comprises a first transistor connected in series with a load element, wherein first transistor provides a current path from said gate node through said load element to the ground voltage in response to said trigger signal; and wherein said by-pass circuit comprises a second transistor connected in parallel with said load circuit, wherein said second transistor provides a current path from said gate node to the ground voltage when the sense amplifier drive signal exceeds the predetermined threshold.

22. An integrated circuit memory device comprising:

a pair of bit lines;

a memory cell connected to one of said bit lines;

a sense amplifier control circuit which generates a sense amplifier drive signal on a sense amplifier drive node responsive to an enable signal, wherein said sense amplifier control circuit comprises, a drive circuit which generates a gating signal in response to a comparison of the sense amplifier drive signal and a predetermined reference signal and in response to a magnitude of the sense amplifier drive signal so that the gating signal has a first magnitude when the sense amplifier drive signal is below a predetermined threshold and a second magnitude when the sense amplifier drive signal is above the predetermined threshold, and a driver which provides electrical energy to said sense amplifier drive node responsive to the gating signal thereby generating the sense amplifier drive signal; and a sense amplifier connected between said pair of bit lines, wherein said sense amplifier detects and amplifies a difference between voltages of said bit lines responsive to the sense amplifier drive signal on said sense amplifier drive node.

23. A method for generating a sense amplifier drive signal on a sense amplifier drive node of a sense amplifier in an integrated circuit memory device including a pair of bit lines, a memory cell connected to one of the bit lines, and a sense amplifier connected between the pair of bit lines, wherein the sense amplifier detects and amplifies a difference between voltages of the bit lines responsive to the sense amplifier drive signal, and wherein electrical energy is provided to the sense amplifier drive node in response to a gating signal, said method comprising the step of:

generating the gating signal in response to a comparison of the sense amplifier drive signal and a predetermined reference signal, and in response to a magnitude of the sense amplifier drive signal, so that the gating signal has a first magnitude when the sense amplifier drive signal is below a predetermined threshold and a second magnitude when the sense amplifier drive signal is above the predetermined threshold.

* * * * *

UNITED STATES PATENT AND TRADEMARK OFFICE
CERTIFICATE OF CORRECTION

PATENT NO. : 5,708,616
DATED : January 13, 1998
INVENTOR(S) : Jong-Hyun Choi

It is certified that error appears in the above-indentified patent and that said Letters Patent is hereby corrected as shown below:

Column 3, line 47, correct "$\Delta SP$" to read --$\phi SP$--.

Column 3, line 48, correct ""$\Delta PSE$" to read --$\phi PSE$--.

Signed and Sealed this

Seventh Day of July, 1998

Attest:

BRUCE LEHMAN

*Attesting Officer*  *Commissioner of Patents and Trademarks*